US008560899B2

(12) United States Patent
Brewerton et al.

(10) Patent No.: US 8,560,899 B2
(45) Date of Patent: Oct. 15, 2013

(54) SAFE MEMORY STORAGE BY INTERNAL OPERATION VERIFICATION

(75) Inventors: Simon Brewerton, Trowbridge (GB); Neil Hastie, Lydney (GB); Paul Hubbert, Bristol (GB); Klaus Oberlaender, Neubiberg (DE); Robert Wiesner, Bad Aibling (DE); Antonio Vilela, Mering (DE); Alfred Eder, Friedberg-Wulferthausen (DE); Glenn Ashley Farrall, Bristol (GB)

(73) Assignee: Infineon Technologies AG, Neubiberg (DE)

( * ) Notice: Subject to any disclaimer, the term of this patent is extended or adjusted under 35 U.S.C. 154(b) by 431 days.

(21) Appl. No.: 12/847,450

(22) Filed: Jul. 30, 2010

(65) Prior Publication Data

US 2012/0030531 A1 Feb. 2, 2012

(51) Int. Cl.
*G06F 11/00* (2006.01)

(52) U.S. Cl.
USPC .......................................... 714/718; 714/719

(58) Field of Classification Search
USPC ............. 714/718, 719, 52–54, 758, 764, 765, 714/768
See application file for complete search history.

(56) References Cited

U.S. PATENT DOCUMENTS

| 4,020,463 | A * | 4/1977 | Himmel | 382/242 |
| 6,438,048 | B1 * | 8/2002 | Kumar | 365/201 |
| 7,760,732 | B2 * | 7/2010 | Bhargava et al. | 370/392 |
| 2006/0221972 | A1 * | 10/2006 | Bhargava et al. | 370/392 |
| 2006/0224838 | A1 * | 10/2006 | Blumrich et al. | 711/146 |

* cited by examiner

*Primary Examiner* — Dieu-Minh Le
(74) *Attorney, Agent, or Firm* — Eschweiler & Associates, LLC

(57) ABSTRACT

The disclosed invention provides a structure and method for detecting address line (e.g., wordline, bitline) memory failures. In one embodiment, the method and structure comprise generating an address signature, by re-encoding an internally generated address signal from activated elements (e.g., wordlines) inside a memory array. The regenerated address signature may be compared with a requested memory address location. If the regenerated address signature and memory location are equal than there is no error in the memory array, but if the regenerated address signature and memory location are equal than an error is present in the memory array. Accordingly, re-encoding an address signature provides a closed loop check that a wordline and/or bitline, that was actually activated in a memory array, was the correct requested wordline and/or bitline, that no other wordlines or bitlines were also triggered, and that the wordline and/or bitline is continuous.

21 Claims, 7 Drawing Sheets

SAFE MEMORY STORAGE BY INTERNAL OPERATION VERIFICATION

FIELD OF INVENTION

The present invention relates generally to a computer memory and in particular to multi-bit error detection in a computer memory.

BACKGROUND OF THE INVENTION

Computers are often employed for safety-critical functions in state-of-the-art transportation systems. Computers may be coupled with sensor systems, configured to sense operations of the transportation system, and to react to possible dangerous situations with a speed and dependability that is unmatched by human capabilities. For example, in automobiles a computer based sensor may be used to regulate the operation of airbags, braking systems, etc.

Safety-critical computer systems often rely upon data stored in a memory (e.g., flash, SRAM, DRAM, etc.) for proper operation. Error correction code (ECC) may be implemented to improve the reliability of memories used to perform safety-critical functions through detecting and correcting memory cell errors. Some error correction codes may be used to detect and correct single-bit errors (e.g., one invalid bit in a particular memory word may be able to be corrected and determined by SECDED). Other, more sophisticated error correction codes, allow the detection and/or correction of double-bit errors (e.g., two invalid bits in a particular memory word may be able to be corrected and determined by DECTED) or even multiple bit errors (e.g., triple bit errors).

FIG. 1 illustrates a block diagram 100 showing an exemplary memory block 102 configured to implement an error correcting mechanism with the use of ECC. As illustrates in FIG. 1, the memory block 102 may comprise a memory array 104, having multiple bitlines activated by a sense amplifier 106 and multiple wordlines activated by a row decoder 108. Respective MOS transistor devices (not shown) configured to store charges corresponding to data bits, may have a first terminal coupled to a bitline, a second terminal coupled to a shared or single source line, and a gate coupled to a wordline.

In order to perform error detection, the memory array 104 is configured to store data fields containing data alongside ECC information bits containing one or more check bits and/or parity bits. Therefore, in general, the memory array 104 includes a plurality of bitlines used in the storage of data bits and a plurality of bitlines used in the storage of ECC information.

When reading data, the data memory addresses, wherein information bits are to be written to, are transmitted together with ECC memory addresses. The data and ECC memory addresses are checked locally by address decoder 116 and address ECC check 114, respectively, before decoding the requested word and bit lines. The data bits and ECC information bits are then read from an address of the memory array 104 by selective activation of a wordline (with row decoder 108) and a bitline (with sense amplifier 106). In particular, during a read operation a wordline may be set to a high data state, thereby activating the gate of a MOS transistor device and causing data stored in the transistor to be driven to a bitline. ECC information bits, read from the memory array, may be used to detect and correct an error in associated data bits read from the memory array.

Similarly, when writing data, data bits and ECC information bits are written into the memory module by selective activation of a wordline (with row decoder 108) and one or more bitlines (with sense amplifier 106). For example, a voltage greater than the threshold voltage of a MOS transistor device may be applied to a wordline, thereby coupling the transistor to the bitline. A bitline is then raised, causing electrons or holes to be injected, to the floating gate. ECC information bits may be calculated, for data bits being written to the memory array, during the write process and written to memory locations associated with the data bits.

DETAILED DESCRIPTION OF THE INVENTION

Figure 1:
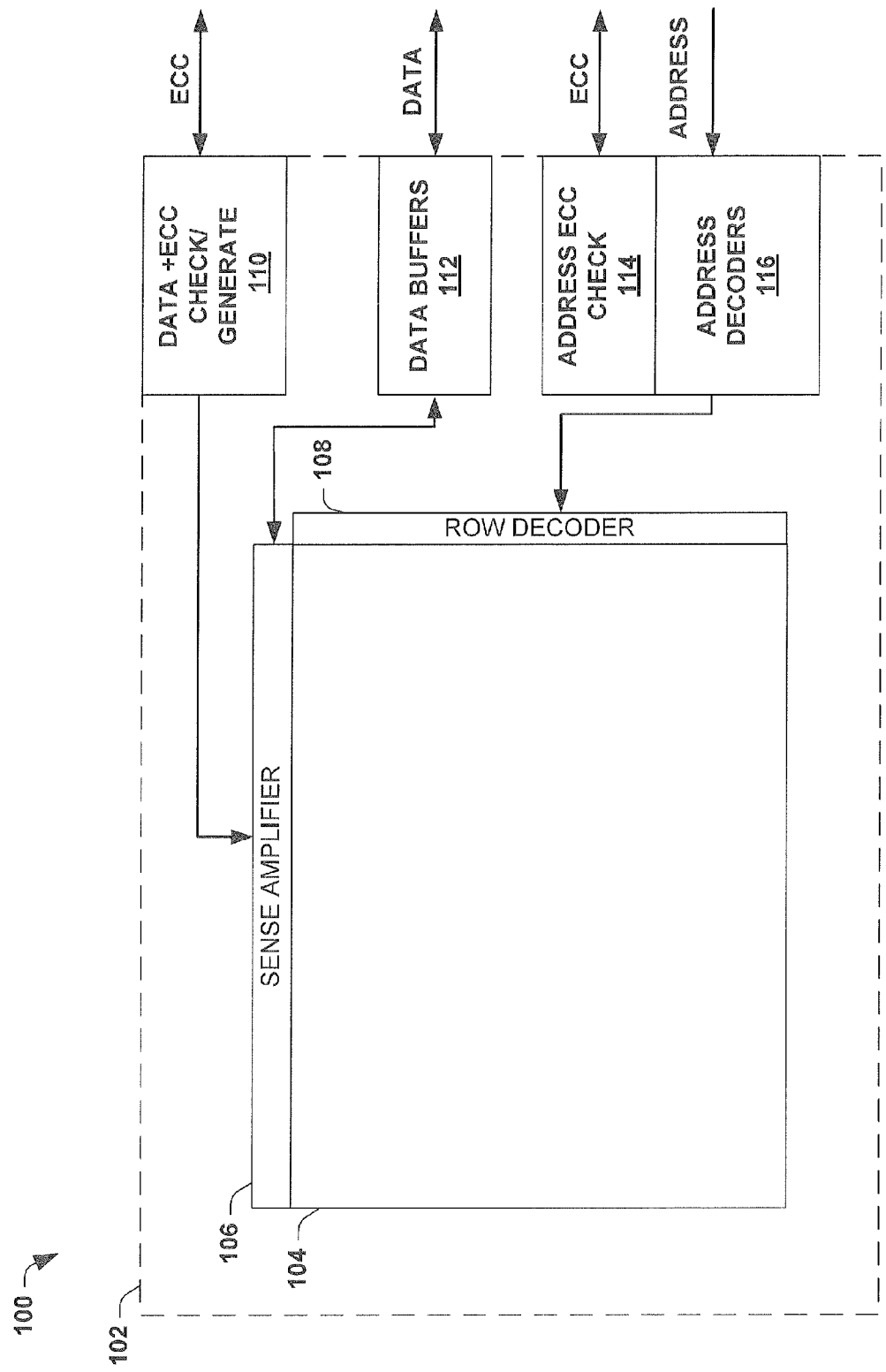
FIG. 1 illustrates block diagram of a memory array comprising data bits and error correction code bits.

The present invention will now be described with reference to the attached drawing figures, wherein like reference numerals are used to refer to like elements throughout, and wherein the illustrated structures and devices are not necessarily drawn to scale.

Error correction code (ECC) is widely used to increase the integrity of data transferred to and from digital memory. However, while protecting stored data using ECC protects against cell based failures (e.g., single bit failures, double bit failures, etc.), it does not offer high diagnostic coverage of address line memory failures that typically produce erroneous multiple bit failures (e.g., breaks in wordlines, cross lines, open lines, shorted lines, etc.). For example, when a plurality of memory cells have been rendered faulty due to a fault in a wordline (e.g., a cross coupled wordline line resulting in the activation of multiple wordlines that do not correspond to the requested memory address), it may not possible to perform detection or correction of the errors using traditional ECC.

Accordingly, a method and structure are disclosed herein for detecting multiple bit address line (e.g., wordline, bitline) memory failures. The method and structure comprise generating an address signature, by re-encoding an internally generated address signal from activated elements (e.g., wordlines) inside a memory array, and comparing the generated address signature with a desired memory address that was requested. Generating (e.g., re-encoding) an address signature provides a closed loop check that a wordline and/or bitline that was actually activated in a memory array was the requested wordline and/or bitline, that no other wordlines or bitlines were also triggered, and that the wordline and/or bitline is continuous. Therefore, as provided herein, comparison of a re-generated address signature to a requested memory address ensures that an activated address lines (e.g., activated wordline and/or bitline) actually corresponds to a requested memory address (e.g., requested wordline and/or bitline).

More particularly, in one embodiment, a memory block may be configured to comprise an address signature generator electrically coupled to address lines of a first memory array (e.g., a SRAM, flash, FeRAM, etc.). The address signature generator is configured to regenerate an address signature from actually selected address lines and/or associated signals inside the first memory array. A comparison circuit may then be used to compare the regenerated address signature to the requested memory address location to ensure that the actually selected wordline and/or bitline in the first memory array was the actually requested wordline and/or bitline. In one embodiment, the comparison circuit may also be configured to provide an error signal (e.g., to a host processor) if the regenerated address signature indicates that the actually activated address lines (i.e., indicated by the regenerated address signature) do not correspond to the requested memory address lines.

It will be appreciated that although the figures provided herein (e.g., FIG. 2-6) describe an address signature generator that may be used to generate an address signature based upon activated wordlines, alternatively an address signature generator may be used to generate an address signature based upon activated bitlines to detect multi-bit bitline errors (e.g., an address signature generator may be configured at the end of the bitlines to return an address signature upon activation of one or more bitlines).

Figure 2:
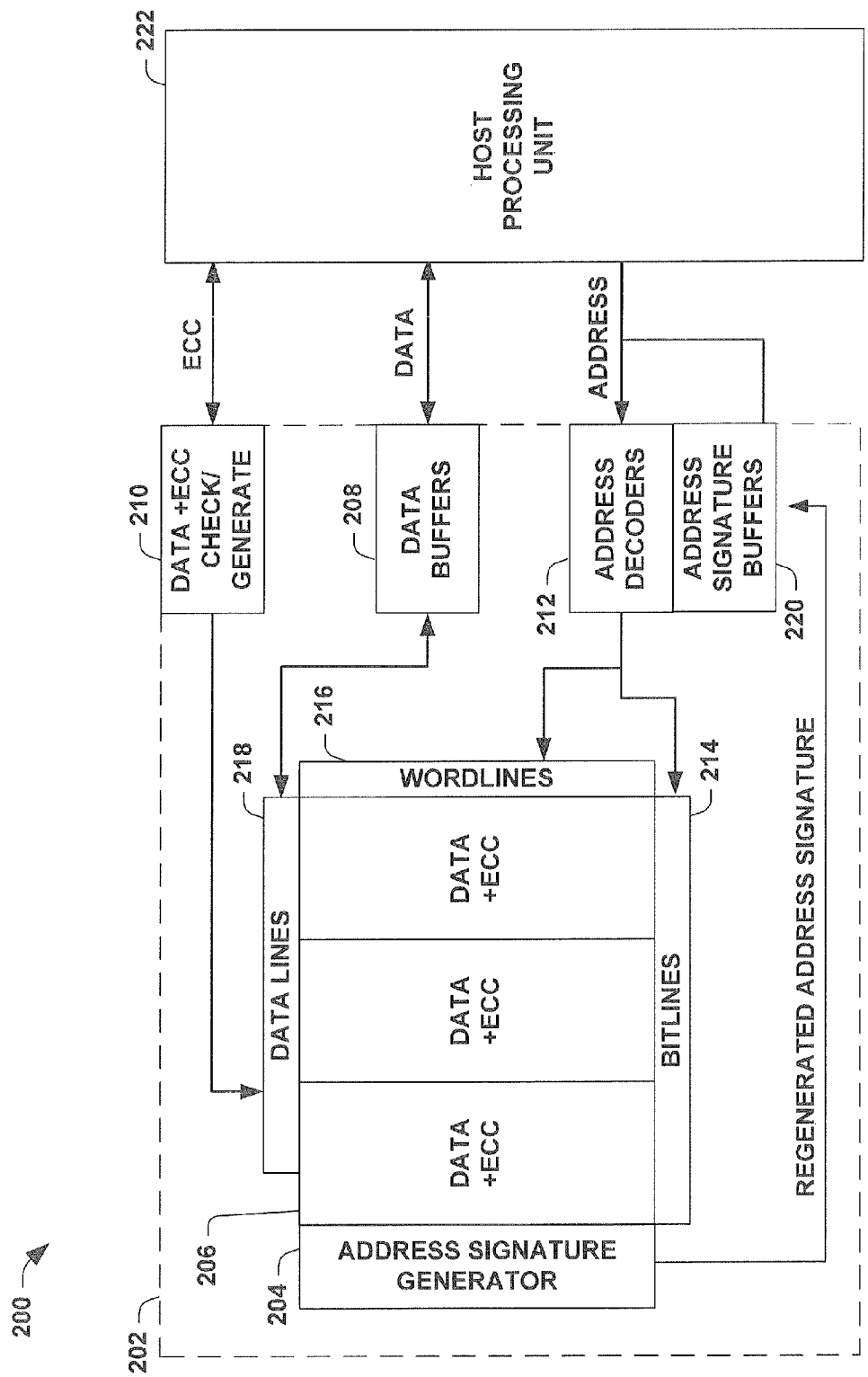
FIG. 2 illustrates a block diagram of a memory block, comprising address signature generator, configured to detect address line failures causing a plurality of memory cell failures.

FIG. 2 illustrates a block diagram 200 of a memory block 202 comprising an internal configuration for detecting address line failures. As illustrated in FIG. 2, the memory block 202 comprises an address signature generator 204 coupled to a first memory array 206. In one embodiment, the first memory array 206 may comprise a matrix structure having substantially parallel wordlines extending in a first direction and driven by a wordline activation circuit 216 coupled to one end of the wordlines. The first memory array 206 may also comprise a plurality of substantially parallel bitlines extending in a second direction, substantially perpendicular to the first direction, and driven by a bitline activation circuit 214 coupled to one end of the bitlines. As shown in FIG. 2, the first memory array may typically comprise a plurality of towers having a certain number of bits wide (e.g., 256 bits) plus some extra bits for error correction code.

During memory operation requests (i.e., read or write requests) data, error correction code (ECC), and/or a requested memory address may be provided (e.g., by a host processing unit 222) to the memory block 202. In one embodiment, data, ECC, and an associated memory address may be transferred to the memory block 202 by way of one or more bus wires.

A data buffer 208 may be configured to receive data from a data bus wire and to temporarily hold the data while it is being moved to the first memory array 206. Similarly, an ECC block 210 may be configured to receive ECC comprising check bits and/or parity bits that are also to be written to a memory location within the first memory array 206. In one embodiment, the ECC block 210 may further be configured to correct data written to and/or read from the first memory array 206 (e.g., ECC check bits may computed by the ECC block 210 prior to writing data to the first memory array 206).

A first address decoder 212 may be configured to receive an address from an address bus wire, wherein the address corresponds to a memory location within the first memory array 206. Based upon the received address, a bitline and a wordline in the first memory array 206 may be selectively activated (e.g., by bitline activation circuit 214 and/or wordline activation circuit 216) to read or write the data to and from the memory location.

In one embodiment, the address signature generator 204 may be coupled to the ends of respective wordlines of the first memory array 206. In such an embodiment, the address signature generator 204 may be activated upon activation of a wordline. Upon activation, the address signature generator 204 and may be configured to generate an address signature based upon the wordline(s) actually activated. In one embodiment, the generated address signature may comprise a lossless encoding of a regenerated address. In an alternative embodiment, the generated address signature may comprise an uncompressed address. In yet another alternative embodiment, the generated address signature can be wider than the actual address to be able to detect multiple wordline and/or bitline selections.

The generated address signature may be compared to the requested address to determine wordline errors in the first memory array 206 (e.g., wordlines having breaks or comprising too high an impedance to allow read/write currents enable it). In one embodiment, the address signature generator 204 may be configured to perform the comparison (e.g., utilizing a comparator circuit). In an alternative embodiment the comparison may be determined by a separate processing unit (e.g., a host processor). As shown in FIG. 2, an address signature buffer 220 is configured to receive the generated address signature from address signature generator 204 and to temporarily hold the generated address signature while it is being moved to a comparison circuit (not shown).

In one embodiment, the generated address signature may be compared to the requested address on every associated data packet so that the consistency of the address can be made on every access. If the regenerated address signature and the associated requested address are the same (e.g., indicate that the same wordline is to be activated), then no error is present in the read or write operation. However, if the regenerated address signature and the associated requested address are not the same (e.g., indicate that different wordlines were activated than requested), then an error is present in the read and/or write operation and an error signal may be provided to a host CPU (not shown) indicating an error in the memory read and/or write operation. In one embodiment, upon detection of an error the host may be given channel control (i.e., bus wire control) to retry the read and/or write operation, thereby avoiding deadlock and other corner cases without limitations in the hardware implementation.

In another embodiment, by generating an address for each data packet write request, the address signature generator may provide an early detection of write errors at the point of use. This early detection allows for localization of the error and permits recovery mechanisms to be used to correct the error at that time (e.g., permits data to be written to an alternative address in the memory array or to an alternative memory block).

Accordingly, as illustrated in FIG. 2, a closed loop checking, inside the internal structure of a memory block, is provided to mitigate address related failures. The closed loop checking ensures that a read or write address request selected in the first memory is the correct memory address.

Although FIG. 2 is illustrated as having an address signature generator coupled to wordlines of a first memory array, it will be appreciated that a separate address signature generator may also or alternatively be coupled to respective bitlines of the first memory array so that the separate address signature generator is activated upon activation of a bitline of the memory array.

Furthermore, it will be appreciated that the re-encoding mechanism described herein may apply to a broad range of applications involving read or write address requests. For example, the re-encoding mechanism (i.e., re-encoding an address signature) may be utilized for a wide range of memory storage mediums, including but not limited to SRAM, DRAM, flash, FeRAM, ROM, etc. In another example, the re-encoding mechanism may be utilized for any decoded address that is provided to a matrix based storage system. In yet another example, the re-encoding mechanism may be utilized for any memory having substantially parallel address lines, comprised within an electronic storage array having a matrix structure. In yet another example, the re-encoding mechanism may be utilized to detect errors in display lines (e.g., LCD display lines) comprising SRAMs coupled to one or more OLEDs. Therefore, the figures and examples provided herein are not intended to limit the application of the re-encoding mechanism.

In one embodiment, by generating an address for each data packet write request, the address signature generator may provide an early detection of write errors at the point of use. This early detection allows for localization of the error and permits recovery mechanisms to be used to correct the error at that time (e.g., permits data to be written to an alternative address in the memory array or to an alternative memory block).

Figure 3:
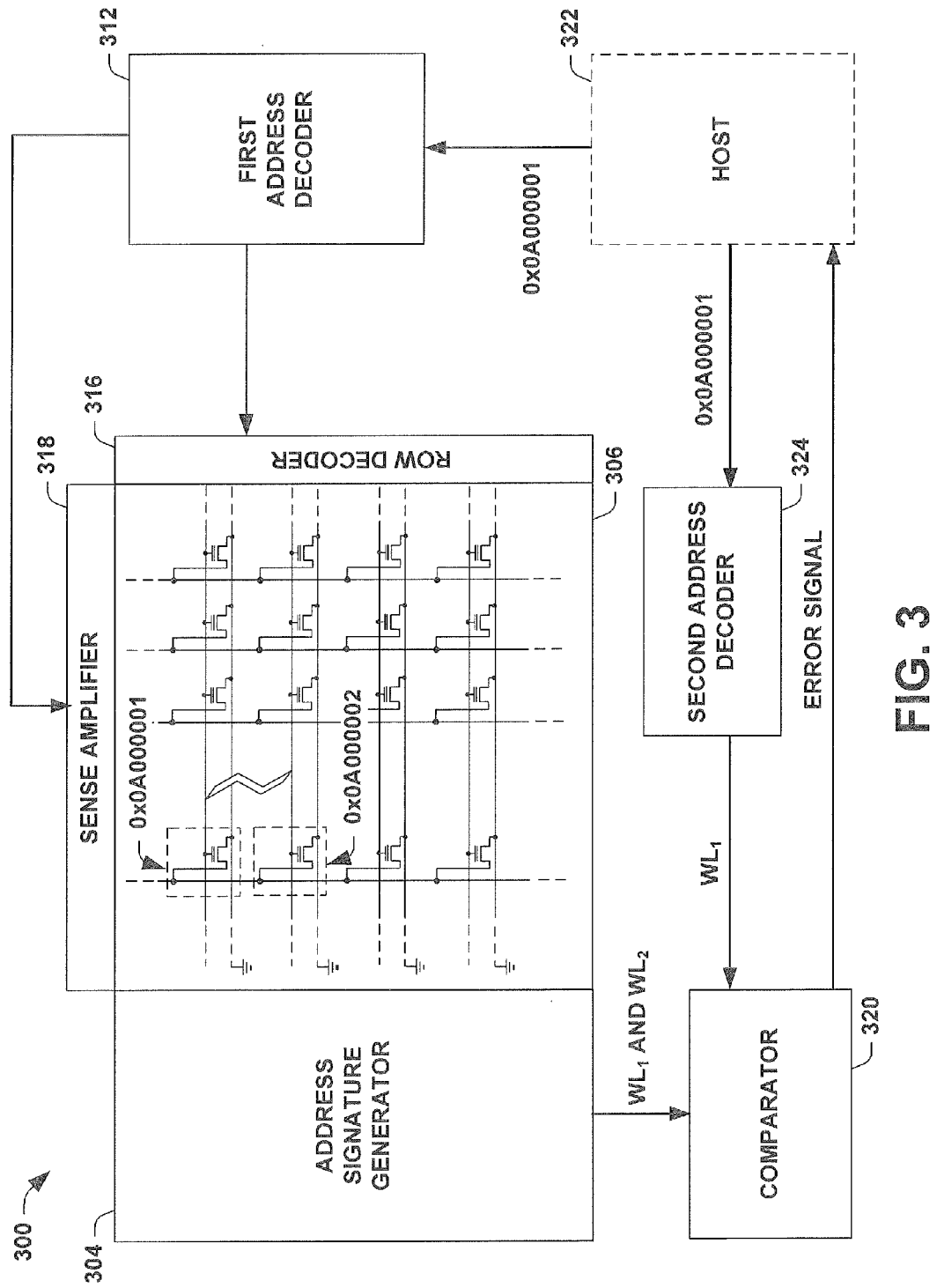
FIG. 3 illustrates a particular example of the operation of an address signature generator as provided herein

FIG. 3 illustrates a block diagram 300 showing a particular example of the operation of an address signature generator as provided herein, wherein the address signature is denoted as an uncompressed memory address. As shown in FIG. 3, a read operation is requested from a memory cell having an address 0x0A000001. In one embodiment, a host may provide an address request to an address decoder 312 and to an address comparator 320.

The address decoder 312 decodes the address (0x0A000001) and selectively sends activation signals to a row decoder 316 and a sense amplifier 318 that are coupled to a first memory array 306. The sense amplifier 318 activates a bitline $BL_1$ associated with the requested memory address while the row decoder 316 activates a wordline $WL_1$ associated with the requested memory address. However, as illustrated in FIG. 3, a short is present between wordlines $WL_1$ and $WL_2$, causing both wordlines $WL_1$ and $WL_2$ to be activated.

The address signature generator 304 regenerates an address signature of the requested address from the actually activated wordlines, $WL_1$ and $WL_2$, inside the first memory array 306. In one embodiment, the activated wordlines may result in a regenerated address signature indicating that wordlines $WL_1$ and $WL_2$ have been activated.

The requested address (0x0A000001) may be provided to a second address decoder 324 configured to decode the requested address to indicate the requested wordlines that are to be activated.

The requested memory address, indicating the activation of wordline $WL_1$, and the regenerated address signature, indicating the activation of wordlines $WL_1$ and WL2, are received by the address comparator 320. Since the requested memory address wordlines and the regenerated address wordlines are different, the address comparator 320 can determine an address wordline related failure (i.e., the address comparator can determine that more wordlines were activated than were supposed to be activated). The address comparator 320 therefore can provide an error signal to the host processing unit indicating an error in the read operation.

Alternatively (not shown), if the requested memory address, requesting the activation of wordline $WL_1$, and the regenerated address signature, indicating the activation of wordline $WL_1$, did match then no error is detected and no error is returned to the host processing unit.

Figure 4:
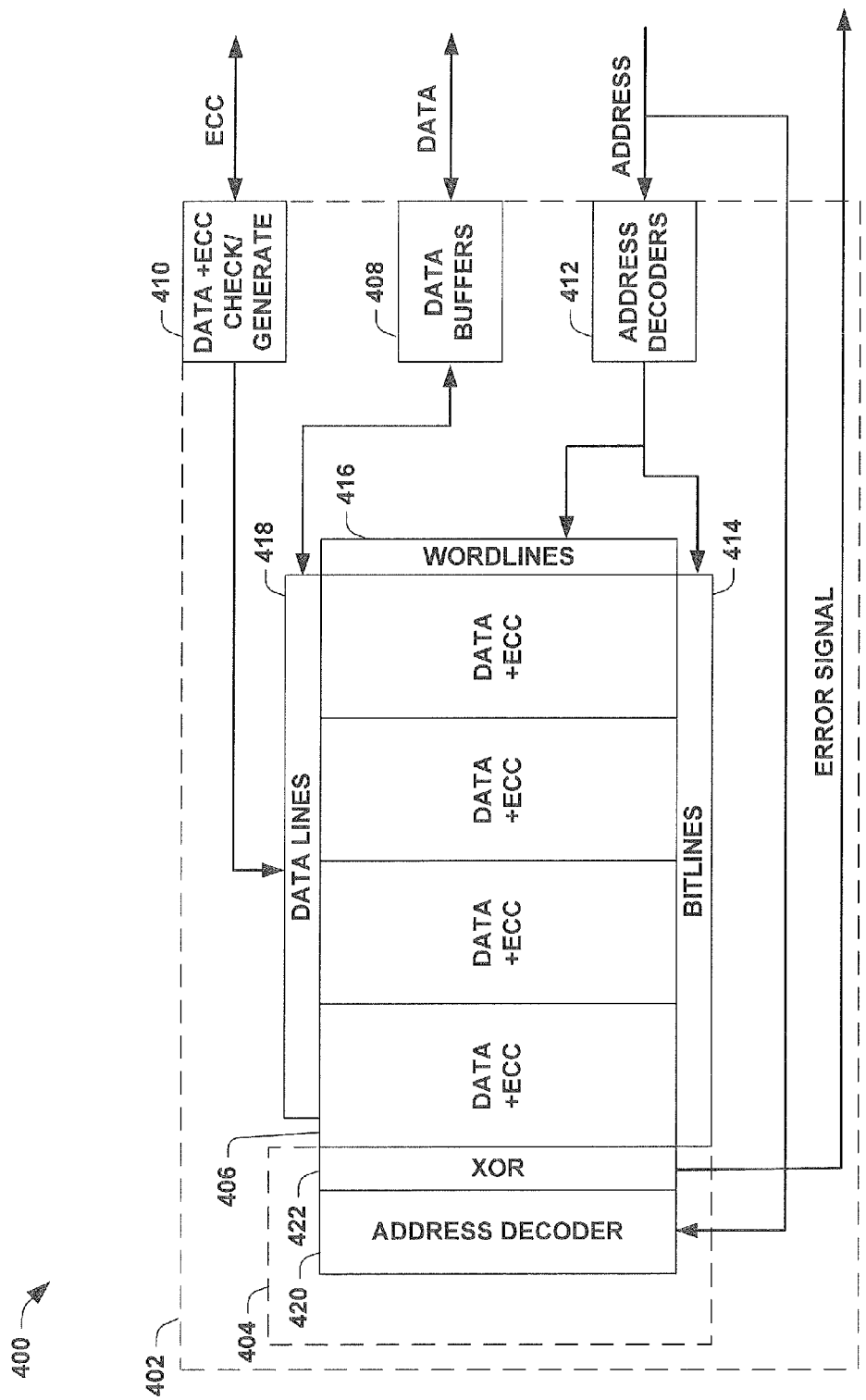
FIG. 4 illustrates an embodiment of a memory block provided herein, wherein the address signature generator comprises an address decoder configured to drive an XOR logic circuit
Figure 5:
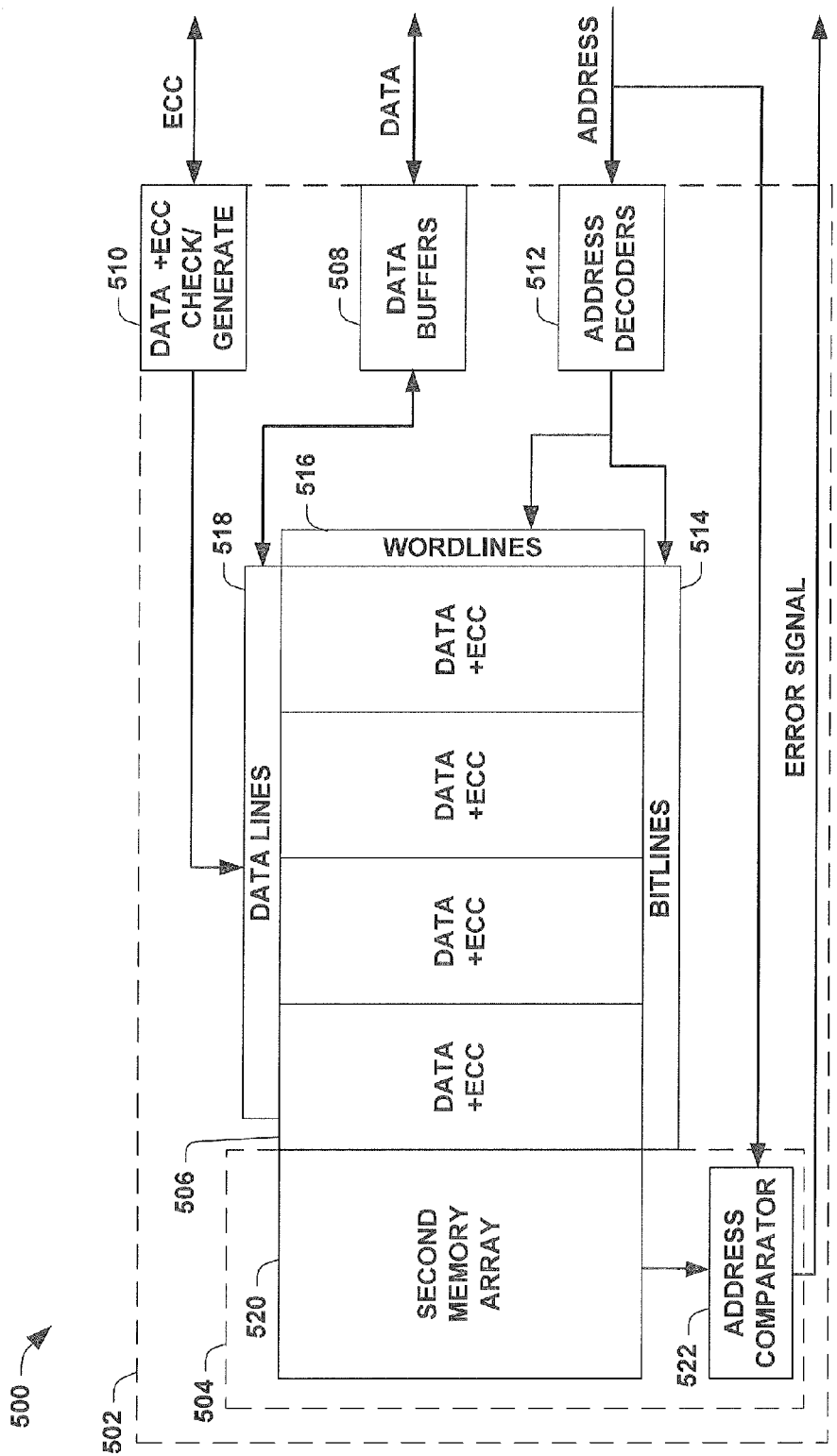
FIG. 5 illustrates an alternative embodiment of a memory block provided herein, wherein the address signature generator comprises a second memory coupled to an address comparator.
Figure 6:
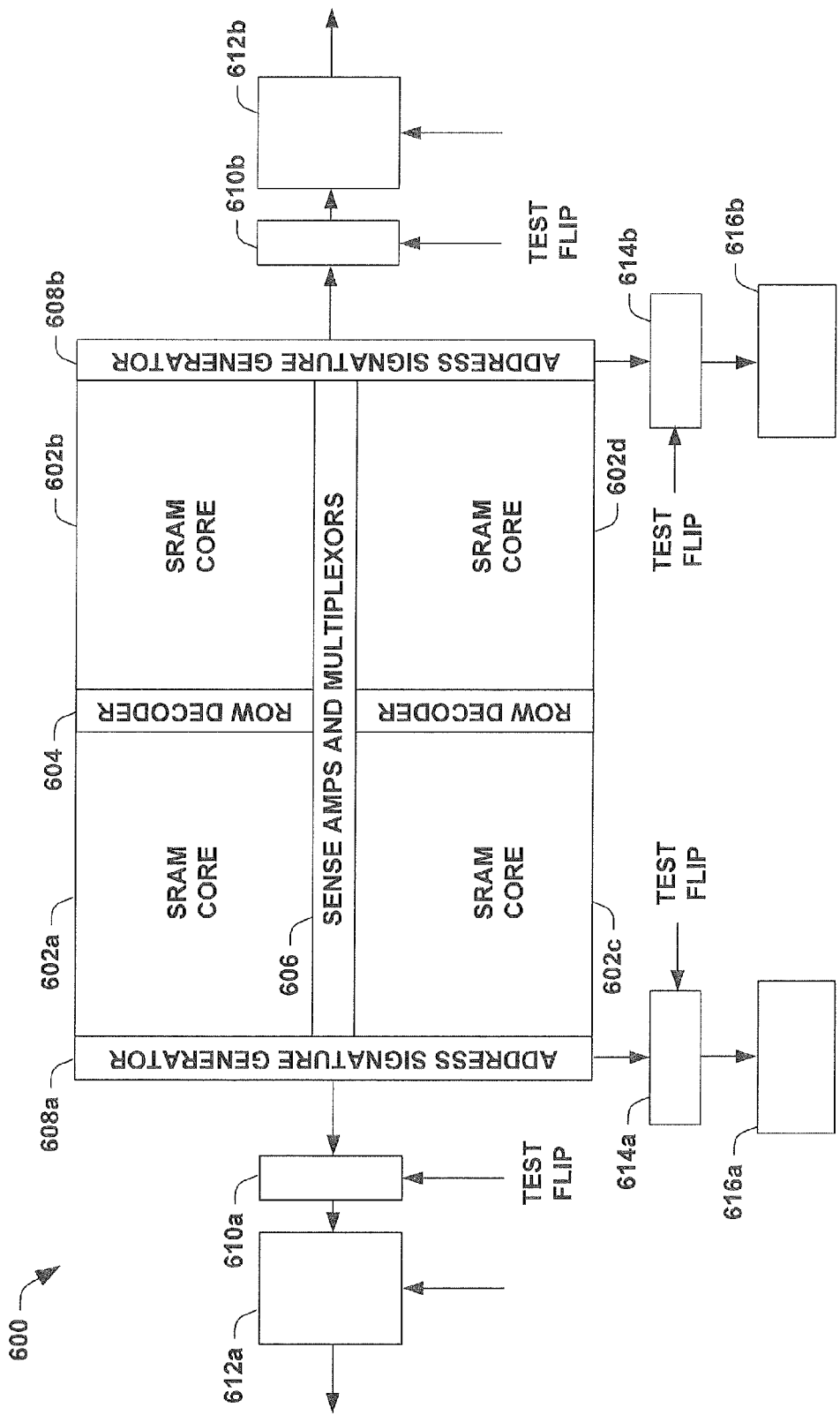
FIG. 6 illustrates a block diagram of one embodiment of a sensor system comprising a measurement circuit for determining capacitive and resistive components of a measurement device.

In various embodiments, the address signature generator may comprise various circuit elements. For example, the address signature generator may comprise an address decoder configured to drive a logic circuitry (e.g., comprising AND, OR, etc. logic gates), in some embodiments. In another embodiment, a mathematical calculation using logic trees on the back end may be used to regenerate an address decoder. FIGS. 4-6 illustrate more detailed illustrations of various exemplary embodiments of an address signature generator as comprised herein. It will be appreciated that FIGS. 4-6 illustrate some exemplary embodiments of an address signature comparator and are not intended to limit designs for a possible address signature generator as provided herein.

FIG. 4 illustrates an embodiment 400 of a memory block 402 wherein the address signature generator 404 comprises a first address decoder configured to activate wordlines within a first memory array 460 and a second, redundant address decoder 420 configured to drive an exclusive OR (XOR) logic circuit 422 configured to implement an XOR logic tree. As illustrated in FIG. 4, a wordline driver 416 is configured to drive the wordlines of the first memory array, and a secondary redundant wordline driver is configured to output wordline addresses to XOR logic circuit 422. The XOR logic circuit 422 may then be used to compare the wordlines generated by the physical wordline actually activated in the memory array 406 with the wordlines generated by the secondary redundant wordline driver.

More particularly, in one particular embodiment, the XOR gate may be implemented by redundantly decoding the address provided by a bus wire using a second address decoder 420 comprised within the address signature generator 404. The redundantly decoded address may indicate, for a requested address, which wordlines are to be activated by providing a high data state for those wordline inputs to the XOR logic circuit 422. The redundantly decoded address may then be compared to a re-generated address, generated from actually selected memory addresses (e.g., activated wordline and/or bitlines), by the XOR logic circuit 422 to detect any error in the wordline and/or bitline selections.

In particular, an n-dimensional XOR logic tree (wherein n corresponds to the number of wordlines present) may be configured to receive signals from the n wordlines in memory array 406 and to receive n wordline signals from the second address decoder 420. Accordingly, the XOR gate may be used to determine that the proper wordline (i.e., the requested wordline) is actually activated.

For example, an activated wordline may produce a high data signal from the actual memory array 406 and a high data signal from the redundant address decoder 420, thereby feeding two high data signals into an XOR logic circuit 422 and resulting in a low data state indicating that no word line error is present. Similarly, an un-activated wordline may produce a low data signal from the actual memory and a low data signal from the redundant address decoder 420, thereby feeding two low data signals into XOR logic circuit 422 and resulting in a low data state indicating that no word line error is present. Alternatively, if the wordline activated in the actually memory array 406 is different than the wordline provided by the redundant address decoder 420, than the a high data state and a low data states will be input into the XOR logic circuit 422 respectively, resulting in a high data state being output from the XOR gate indicating an error.

Therefore, an XOR logic circuit 422 may be used to return an error signal if the selected wordlines of the regenerated address are not equal to the actual word line selections. The redundant address decoder and inversely generated addresses allow for the use of a simple logic device to detect multiple bit errors.

FIG. 5 illustrates an alternative embodiment of a memory block provided herein, wherein the address signature generator 522 comprises a second memory 512 coupled to an address comparator 514. The second memory 512 may be configured to store address information (e.g., an address signature) related to read and/or write requests and upon activation (e.g., upon receipt of a read or write request at the memory block 504) to deliver an address signature of the requested address to the address comparator 514.

The address comparator 514 is configured to receive the address signature and compare it to the requested memory address location. In one embodiment, if the address signature and the re-generated address are the equal (i.e., if the wordlines lines of the generated address signature are the same as the wordlines of the requested memory address.), then no error is present in the read or write operation. However, if the address signature and the re-generated address are not equal (e.g., if the wordlines of the generated address signature are not the same as the wordlines of the requested memory address.), then an error is present in the read or write operation and the address signature generator is configured to provide an error signal to the control unit, indicating an error in the memory read or write operation.

In one embodiment, the second memory array 520 may comprise a read only memory (ROM). The ROM may be configured to re-encode the selected wordlines into an address signature that can be compared to the generated address one cycle later. In particular, the ROM may be configured to store data bits (e.g., high data states, low data states) using a single transistor. By putting an address signature of decoded wordlines in a ROM, the activation of wordlines causes data to be deliver data out of ROM for whatever wordline is being triggered. From data coming out of ROM, an algorithm can be used to tell if correct wordline was activated or if multiple other wordlines were activated.

In one embodiment, a plurality of transistors may be held in either a high data state or a low data state. When a wordline is activated it will output the stored data bits corresponding to an activated wordline, as part of an address signature, from the ROM. A complete address signature may be generated by the collective output of a plurality of transistors (e.g., outputting 0s and 1's for non-activated wordlines and activated wordlines, respectively). For example, a ROM may be configured to regenerate an address signature based upon the activation of a plurality of wordlines that cause the ROM to output a high stored data, associated with the wordlines, to a comparator. The ROM may also be configured to have an invalid default when its associated wordline is not selected.

For example, each wordline of a memory array 506 may have two corresponding ROM cells: a first transistor of a ROM cell may be configured to store a high data state associated with a wordline, while a second transistor of a ROM cell may be configured to store a low data state associated with the same wordline. If the wordlines is activated, the high data state stored in the first transistor of the ROM is delivered to the address comparator as part of an address signature. If the wordlines is not activated, the low data state stored in the second transistor of the ROM is delivered to the address comparator as part of an address signature. Therefore, by putting signature data of decoded address lines in a ROM, the ROM may be used to re-encode an address signature based upon selectively activated wordlines and/or bitlines.

Furthermore, it will be appreciated that using a ROM as the second memory array 520 may provide an improved storage density over alternative memories (e.g., SRAMs, FeRAM, etc.), thereby providing an economic way of storing additional address related information in comparison to using SRAM cells for the storage of ECC bits. For example, using a ROM to store high and/or low data states may provide a significant area savings over storage of ECC in an SRAM since a ROM is approximately $\frac{1}{6}^{th}$ the size of an SRAM cell.

In one embodiment, each SRAM array is configured to contain one associated ROM. In another embodiment, bitlines can be protected by using additional ROMs or by the use of duplicated decoding.

FIG. 6 illustrates an embodiment of an SRAM memory array 600 having an address signature generator, as provided herein. As illustrated in FIG. 6, an SRAM memory is built to comprise a plurality of separate SRAM cores (602a, 602b, 602c, and 602d). A row decoder 604, configured laterally between cores of the SRAM memory, is configured to drive wordlines of the SRAM cores located to the right and left of the decoder (e.g., row decoder 604 drives the wordlines of SRAM core 602a and the wordlines of SRAM core 602b). Sense amplifiers and multiplexors 606, configured vertically between cores of the SRAM memory, are configured to read the bitlines of the SRAM cores located above and below the sense amplifier and multiplexors 606 (e.g., sense amplifier and multiplexors 606 read the bitlines of SRAM core 602a and the bitlines of SRAM core 602c).

FIG. 6 utilizes two address signature generators 608a and 608b (e.g., ROM signature generators), located at each end of the SRAM cores' wordlines, to detect wordline failures. Locating the address signature generators 608a and 608b at the end of the SRAM cores (e.g., 602a and 602b) would allow for errors along the entire length of the wordlines (e.g., from the row decoder to the end of the wordlines) to be detected In safety-critical systems, there may be a need to be able to test address comparators (e.g., 612a, 612b, 612c, 612d) in real time to ensure proper operation (e.g., a stuck comparator, consistently outputting a high data state, may falsely indicate that a proper address is being read from/written to). Accordingly, test circuits (e.g., 610a and 610b) may be used to test operation of the address comparators (e.g., 612a and 612b, respectively). Respective test circuits (e.g., 610a) are configured to generate an erroneous address signature that may be selectively provided to the address comparator (e.g., 612a), thereby simulating an address line error in the SRAM cores (e.g., 602a). Purposely generating an erroneous address signature may be done to test the operation of the address comparators.

For example, if there are no breaks in address lines of a memory (e.g., all wordlines are intact), the address signature generator (e.g., ROM) will consistently generate a "right" address signature to the address comparator and no errors will be returned. However, consistently finding no errors may also be due to an error in the comparator operation. Therefore, being able to purposely send an erroneous address signature may be used to determine if there is an error in the comparator operation. For example, if an erroneous address signature is provided to the comparator and the comparison does not result in an error signal, then it can easily be determined that the address comparator is malfunctioning.

As illustrated in FIG. 6, test circuits 610a and 610b are configured to receive a regenerated column address signature and a test flip bit. The test circuits 610a and 610b are configured to modify the column address signatures generated by the address signature generators 608a and 608b. For example, in one embodiment, the test circuits 610a and 610b may modify (e.g., toggle) the data bits of the address signature generated by address signature generators 608a and 608b, respectively. The erroneously modified address signatures may then be output to the address comparator, 612a and 612b respectively, where they are compared to a column address, to test the operability of the address comparator.

In one embodiment, a secondary "test flip" mechanism may be used to be used to diagnose the operation status of address comparator in real time, thereby indicating if there are operation errors in the address comparator. For example, test circuits 614a and 614b may also and/or alternatively be configured to receive a regenerated row address signature and a test flip bit. The test circuits 614a and 614b may be similarly configured to erroneously modify the row address signatures generated by the address signature generators to generate an erroneous row address signature.

Figure 7:
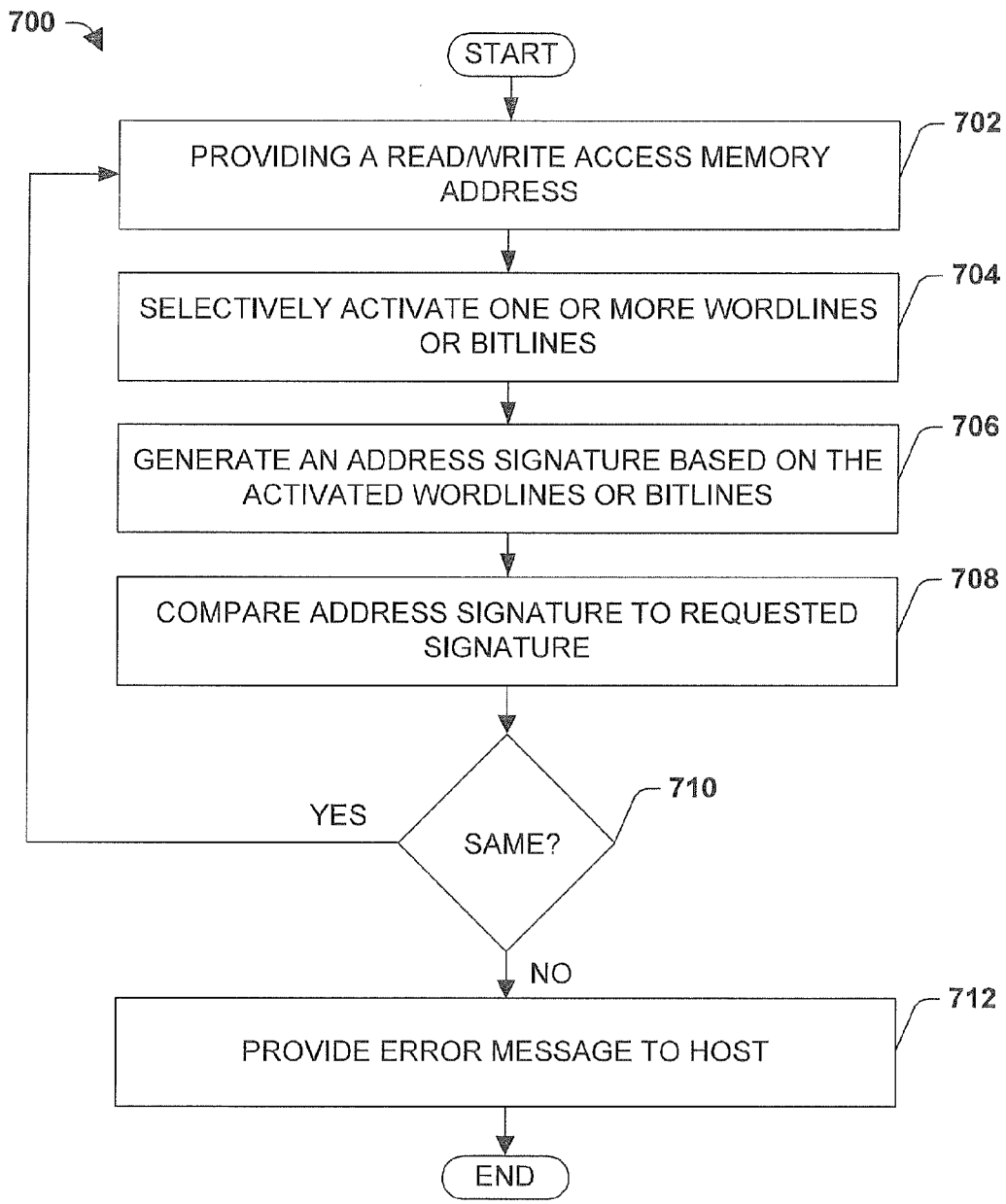
FIG. 7 is a flow diagram illustrating an exemplary method detecting address line errors causing multiple bit failures in a data stream being transmitted in a computer system.

FIG. 7 is a flow diagram illustrating an exemplary method detecting address line errors causing multiple bit failures in a data stream being transmitted in a computer system. In particular, a re-encoded address signature is generated from activated bitlines and/or wordlines of a memory array with every read and/or write access. The generated address signature is compared with a requested address, associated with the read or write request, on every associated data packet so that the consistency of the address request and signature.

While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 702 a read and or write address request is generated. The read or write address request may be generated in response to a read or write request from a host CPU. The read or write request indicates a memory address location (e.g., 0x0A0001) in a first memory array that data is to be read from or written to. In one embodiment, the request may be made to a first memory array comprising a plurality of substantially parallel wordlines driven by a row decoder, coupled to a first end of the plurality of wordline, and a plurality of substantially parallel bitlines, perpendicular to the plurality of wordlines and read by a sense amplifier coupled to a first end of the plurality of bitlines.

One or more wordlines or bitlines are selectively activated at 704. The one or more wordlines or bitlines are selectively activated to write data to or read data from the memory address location. A generated address location may be decoded so as to determine a bitline and wordline that are to be selectively activated.

At 706 an address signature based on the activated bitlines and wordlines is generated. The read or write address may be generated based upon activated wordlines, alternatively an address signature generator may be used to generate an address signature based upon activated bitlines to detect multiple bit bitline errors (e.g., an address signature generator may be configured at the end of the bitlines to return an address signature upon activation of one or more bitlines). In one embodiment, the address signature may comprise a lossless encoding of a regenerated address. In an alternative embodiment, the address signature may comprise an uncompressed address.

It will be appreciated that the address signature may be generated by an address signature generator. In one embodiment, a first address signature generator may be coupled to an opposite end of the plurality of wordlines than a row decoder. In another embodiment, a second address signature generator is coupled to a second opposite end of the plurality of bitlines than the sense amplifier, resulting in a sense amplifier flanked by address signature generators.

In one embodiment, generating the address signature may comprise storing a plurality of data bits, having additional address information, in a memory array. In one embodiment, the memory array may comprise a read only memory (ROM) having storage elements configured to store high and low states. Each storage element may correspond to a piece of the address signature associated with a respective wordline and/or bitline. Stored additional address information may be output as the address signature based upon the activation of wordlines, wherein a plurality of outputted address bits comprises the regenerated address signature.

The generated address signature is compared to the requested memory address location at 708. The address comparator can determine that the more wordlines were activated than were supposed to be activated based upon the requested address In one embodiment, if the address signature and the re-generated address are the same, then no error is present in the read or write operation. However, if the address signature and the re-generated address are not the same and the address signature generator is configured to provide an error signal to the control unit, indicating an error in the memory read or write operation.

However, if the generated address signature is not equal to the requested memory address location (e.g., the address signature indicates multiple wordlines were activated), then an error is present in the read or write operation and the memory operation was not successfully completed.

An error signal may be provided to the host indicating that there was an error in writing data to the memory array. The error may be due to crossed wordlines causing a plurality of wordlines to be erroneously activated, for example. Alternatively, the error may be due to wordline shorts, breaks in a wordline, etc. In one embodiment, upon detecting an address line error, a host processor is allowed channel control (i.e., bus wire control) to enable a retry mechanism such that deadlock and other corner cases can be avoided without limitations in the hardware implementation.

In another embodiment, method 700 may further comprise a method for testing the comparison of 708. In one embodiment, the method for testing the comparison may comprise selectively generating an erroneous address signature that may be provided for comparison to the requested address location instead of the generated address signature. It will be appreciated that the erroneous address signature may be utilized to test operation of the comparison. For example, if an erroneous address signature is provided for comparison and does not result in an error signal being generated, then the comparison is not being performed properly.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory block, comprising:
a host processing unit configured to provide a memory operation request comprising a requested memory address;
a first memory array having a plurality of address lines;
a first address decoder configured to receive the requested memory address and to selectively activate a respective address line associated with the requested memory address; and
an address signature generator configured to receive the memory operation request and further configured to generate an address signature based upon the activated address line and to compare the generated address signature and the requested memory address,
wherein an error signal is generated if the address lines of the generated address signature are not the same as the address lines of the requested memory address.

2. The memory block of claim 1, wherein the address signature generator comprises:
a second memory array configured to store additional address information; and
an address comparator configured to receive the generated address signature and the requested memory address, compare the generated address signature and the requested memory address, and to generate the error signal.

3. The memory block of claim 2, wherein the second memory array comprises a read only memory (ROM) and wherein the additional address information comprises the address signature.

4. The memory block of claim 1, wherein the address signature generator comprises:
a second address decoder configured to receive the memory operation request and to generate wordline activation signals indicating the wordlines that are to be generated based upon the received memory operation request; and
a logic circuitry coupled to the first memory array and the second address decoder,
wherein the logic circuit is configured to receive wordline activation signals from the first memory array and the generated wordline activation signals from the second address decoder and to determine erroneously activated wordlines therefrom.

5. The memory block of claim 4, wherein the logic gate comprises an exclusive OR gate.

6. The memory block of claim 1, wherein:
the first memory array comprises a plurality of substantially parallel wordlines driven by a row decoder coupled to a first end of the plurality of wordlines, and the address signature generator is coupled to a second opposite end of the plurality of wordlines than the row decoder.

7. The memory block of claim 6, wherein:
the first memory array comprises a plurality of substantially parallel bitlines, substantially perpendicular to the plurality of wordlines, read by a sense amplifier coupled to a first end of the plurality of bitlines, and
a second address signature generator is coupled to a second opposite end of the plurality of bitlines than the sense amplifier.

8. The memory block of claim 1, wherein the address signature comprises an uncompressed address or a lossless encoding of the generated address.

9. The memory block of claim 1, wherein upon generation of an error signal, the host processing unit is given bus wire control to retry writing data to the first memory array.

10. The memory block of claim 1, further comprising a test circuit configured to selectively generate an erroneous address signature that may be provided to the address comparator, thereby intentionally causing the address comparator to output the error signal.

11. A method for detecting errors in a data stream being transmitted in a computer system, comprising:
providing a requested address location within a first memory array for a memory operation request to an address decoder coupled to the first memory array and an address signature generator;
selectively activating one or more address lines in the first memory array based upon the requested address location;
generating a regenerated address signature based upon the selectively activated address lines; and
comparing the requested address location to the regenerated address signature, wherein the comparison identifies the presence of address line errors in the first memory array.

12. The method of claim 11, wherein the address signature comprises an uncompressed address or a lossless encoding of the regenerated address.

13. The method of claim 11, wherein generating a regenerated address signature comprises:
storing a plurality of data bits having additional address information in a second memory array, wherein respective data bits comprise address information corresponding to the address signature of a wordline; and
selectively outputting the stored additional address information based upon activation of the wordline.

14. The method of claim 13, wherein the second memory array comprises a read only memory (ROM).

15. The method of claim 11, wherein:
the first memory array comprises a plurality of substantially parallel wordlines driven by a row decoder coupled to a first end of the plurality of wordlines, and
a first address signature generator is coupled to a second opposite end of the plurality of wordlines than the row decoder.

16. The method of claim 15, wherein:
the first memory array comprises a plurality of substantially parallel bitlines, substantially perpendicular to the plurality of wordlines, read by a sense amplifier coupled to a first end of the plurality of bitlines, and
a second address signature generator is coupled to a second opposite end of the plurality of bitlines than the sense amplifier.

17. The method of claim 11, further comprising:
selectively generating an erroneous address signature that may be provided for comparison to the requested address location instead of the generated address signature,
wherein the erroneous address signature may be utilized to test operation of the comparison.

18. The method of claim 11, further comprising retrying writing data to the first memory array upon identification of the address line errors in the first memory array.

19. A memory block, comprising:
a re-encoding mechanism coupled to a plurality of substantially parallel address lines, comprised within an electronic storage array having a matrix structure, and configured to re-generate an address signature based upon one or more of the plurality of address lines which are actually activated during an electronic storage operation; and
a comparison circuit configured to compare the re-generated address signature and a requested memory address.

20. The memory block of claim 19,
wherein if the address lines of the re-generated address signature are the same as address lines of the requested memory address, then no address line error is present, and
wherein if the address lines of the re-generated address signature are not the same as address lines of the requested memory address, then an address line error is present.

21. The memory block of claim 19,
wherein if address lines of the re-generated address signature are equivalent to address lines of the requested memory address, then no address line error is present, and
wherein if address lines of the re-generated address signature are not equivalent to address lines of the requested memory address, then an address line error is present.

* * * * *